United States Patent [19]

Dill et al.

[11] 4,033,797
[45] July 5, 1977

[54] METHOD OF MANUFACTURING A COMPLEMENTARY METAL-INSULATION-SEMICONDUCTOR CIRCUIT

[75] Inventors: Hans G. Dill, Costa Mesa; Thomas N. Toombs, Irvine, both of Calif.

[73] Assignee: Hughes Aircraft Company, Culver City, Calif.

[22] Filed: Apr. 23, 1975

[21] Appl. No.: 570,687

Related U.S. Application Data

[63] Continuation of Ser. No. 362,025, May 21, 1973, abandoned, which is a continuation of Ser. No. 147,093, May 26, 1971, abandoned.

[52] U.S. Cl. .................................. 148/187; 29/571; 29/578; 148/1.5; 148/174; 357/23; 357/42; 357/59; 357/91
[51] Int. Cl.² ............... H01L 21/22; H01L 21/283; H01L 29/78
[58] Field of Search .......... 148/174, 175, 187, 1.5; 29/571, 578; 357/23, 42, 59, 91

[56] References Cited

UNITED STATES PATENTS

| 3,646,665 | 3/1972 | Kim | 29/571 |
|---|---|---|---|
| 3,667,009 | 5/1972 | Rugg | 357/23 |
| 3,673,471 | 6/1972 | Klein et al. | 148/175 X |
| 3,673,679 | 7/1972 | Carbajal et al. | 29/571 |
| 3,699,646 | 10/1972 | Vadasz | 29/571 |

*Primary Examiner*—L. Dewayne Rutledge
*Assistant Examiner*—W. G. Saba
*Attorney, Agent, or Firm*—W. H. MacAllister; Joseph E. Szabo

[57] ABSTRACT

A circuit comprised of interconnected complementary MIS devices is formed in a common semiconducting substrate by forming a plurality of complementary substrate regions in the common substrate, one region for each device whose source and drain regions are to have the same conductivity type as the common substrate. The other devices whose source and drain regions are to have the opposite conductivity type from that of the common substrate are formed directly therein. Interconnections between the devices are provided by a two-layer grid, the bottom layer of which is comprised of polycrystalline silicon conductors which also serve as the gates for the MIS devices. The top layer of the grid is comprised of a second set of conductors which is insulated from the bottom layer but which makes connection thereto and to the source and drain regions as well as to the complementary substrate at selected points. The regions of the substrate between adjacent MIS devices are covered by an oxide layer which extends both below and above the substrate surface and both ion implantation and the use of a doped oxide is disclosed for forming the complementary substrate regions.

2 Claims, 15 Drawing Figures

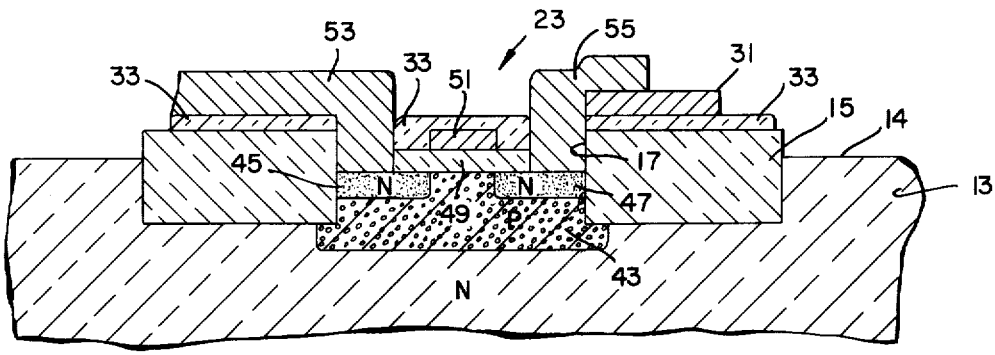
Fig. 2.
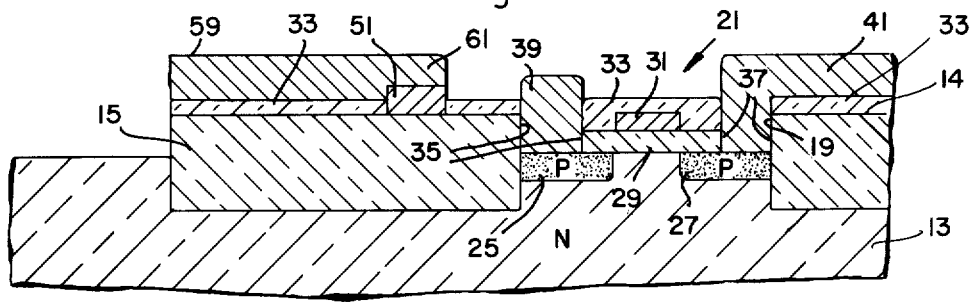
Fig. 3.
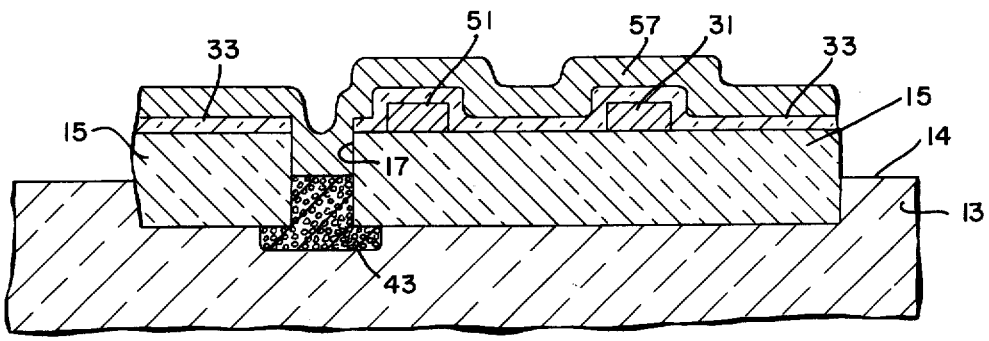
Fig. 4.
Fig. 1.
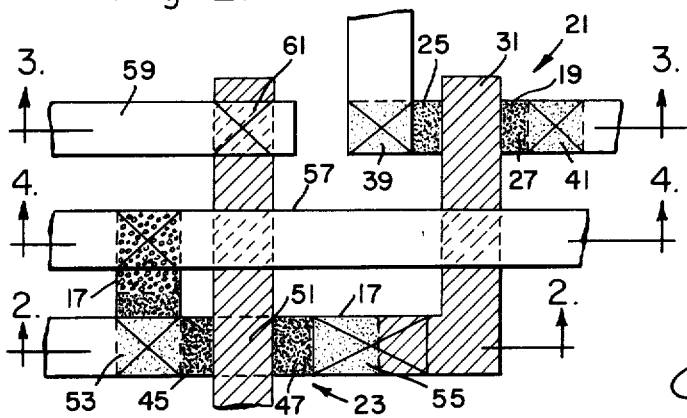
Hans G. Dill,
Thomas N. Toombs,
INVENTORS.
BY.
ATTORNEY.

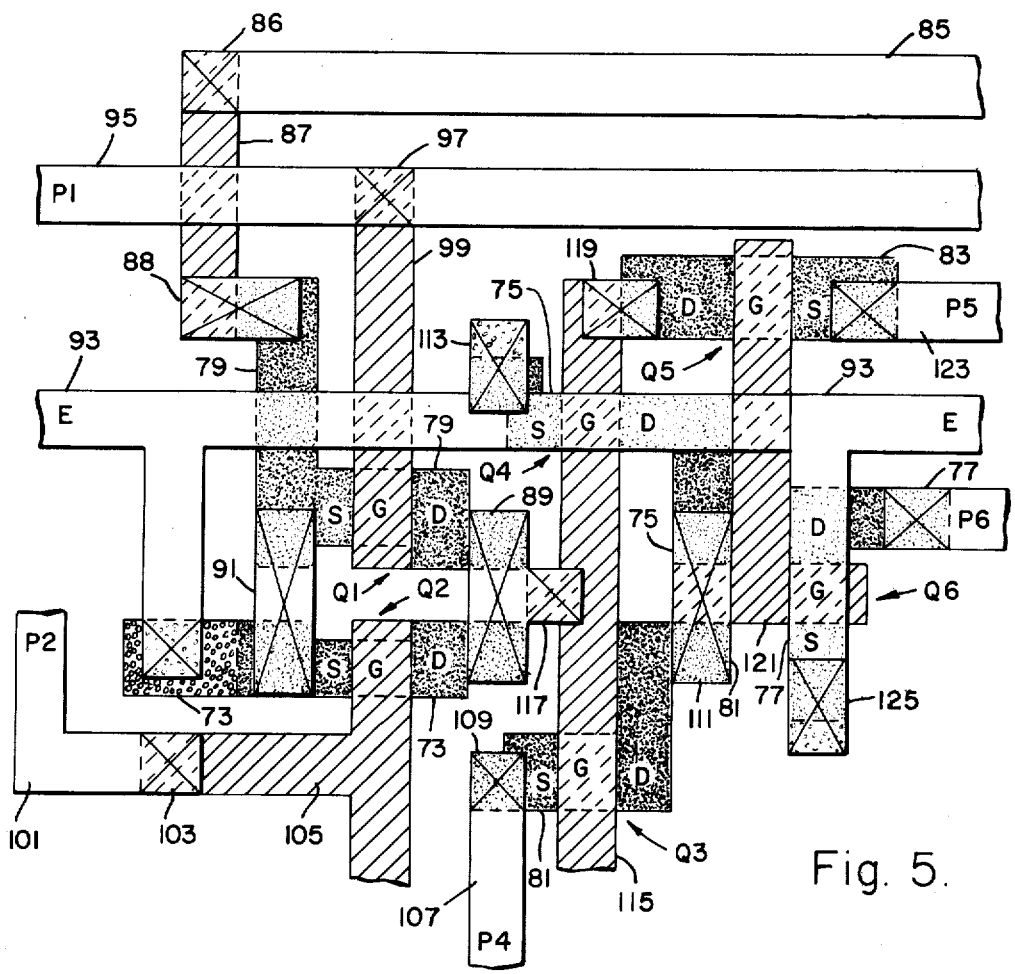
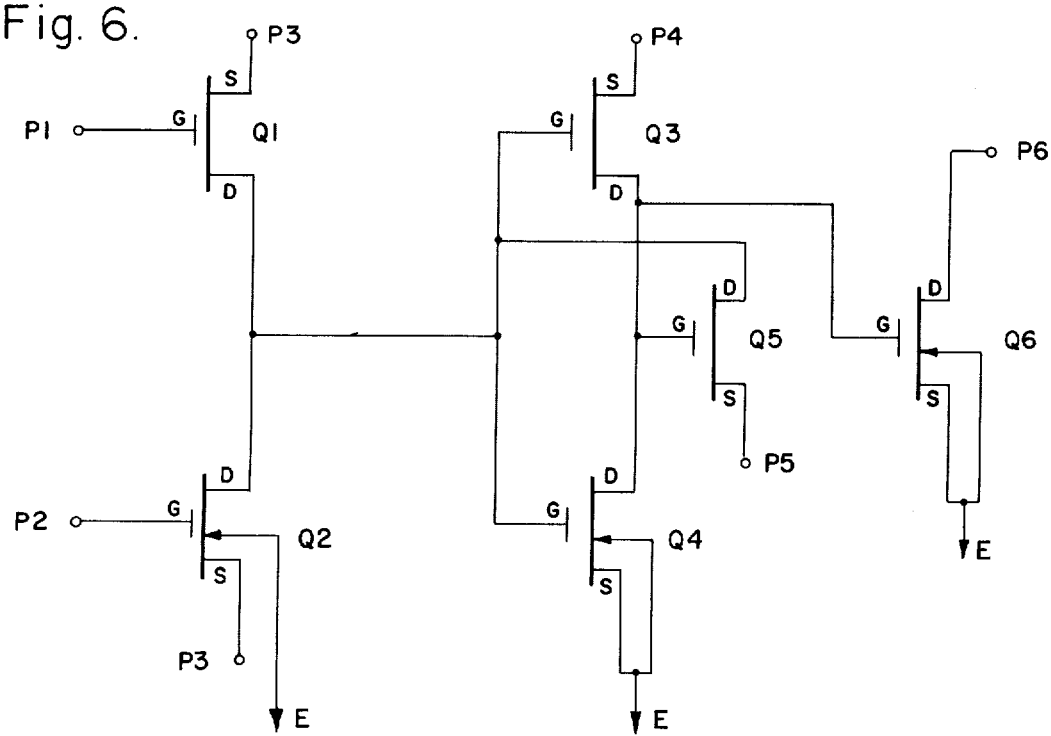
Fig. 5.
Fig. 6.

METHOD OF MANUFACTURING A COMPLEMENTARY METAL-INSULATION-SEMICONDUCTOR CIRCUIT

This is a continuation of application Ser. No. 362,025, filed May 21, 1973, now abandoned, which is itself a continuation of Ser. No. 147,093 filed May 26, 1971 (now abandoned).

The present invention relates to MISFET integrated circuits, which comprise a plurality of metal-insulator-semiconductor (MIS) devices formed in a common semiconducting wafer or substrate. Typically, such integrated circuits include many pairs of relatively highly doped regions at the surface of a relatively lightly doped semiconducting substrate, these regions having a conductivity type which is the opposite of that of the substrate. A thin (approximately 1200 A) insulating layer called the "gate insulator" is formed on the surface of the substrate between each pair of doped regions and a conducting gate electrode is deposited upon the insulating layer. Metal electrodes are connected to the doped regions, one of which is called the "source" and the other the "drain". Current flows from the source to the drain through a conductive layer, called a "channel", which is induced at the surface of the semiconductor by a potential applied to the gate electrode, with the magnitude of the current for a given source-to-drain voltage being modulated by the gate potential. The area of the common substrate between adjacent MIS devices is covered by a relatively thick (typically 1 to 2 microns) insulating layer, called the "field insulator".

For certain circuit applications it has been found advantageous to provide in a common substrate both P-channel and N-channel devices, the latter having source and drain regions of N-type conductivity. Typically to accommodate the N-channel devices in a substrate of N-type silicon, a portion of that substrate immediately surrounding the N-type source and drain regions is converted to have a P-type conductivity, these regions being called a complementary substrate. Heretofore it has been customary to form a single complementary substrate for a relatively large number of N-channel devices (where the common substrate is of P-type conductivity). It has also been customary to provide a single layer of interconnections between the P-channel devices and the N-channel devices in the common substrate. The clustering of like devices in a common, relatively large complementary substrate has created complex interconnecting patterns between the N-channel and P-channel transistors. Yet the provision of a single interconnecting layer has limited the attainable circuit complexity drastically.

It is a principal object of the present invention to provide a technique for producing an integrated complementary semiconductor circuit whose physical complexity for a given circuit complexity is inherently lower than those of presently existing integrated circuits.

It is a further object of the present invention to provide a complementary semiconductor integrated circuit having interconnecting means which permit a greater physical complexity than has been found possible with present techniques.

A correlative object of the invention is to produce a complementary metal-insulator-semiconductor integrated circuit which is compact and yet can be made to be electrically more complex than presently existing circuits of the same type.

In accordance with the invention the above and other objects are attained by a complementary MIS integrated circuit formed in a common semiconductor substrate of a given conductivity type on a surface of which a first insulating layer is formed. Preferably this insulating layer extends both above and below the substrate surface and includes a pair of openings for each pair of MIS devices. Under one of the openings, a complementary substrate region is formed in the substrate, the complementary substrate region having a conductivity type which is opposite that of the substrate which surrounds it. A pair of source and drain regions is formed under each of the openings, one pair being in the substrate and the other in the complementary substrate, with both pairs of regions having a conductivity type which is opposite that of the substrate, or complementary substrate, which immediately surrounds it.

Between each pair of spaced apart source and drain regions a gate electrode is disposed, being spaced from the substrate, or complementary substrate, by an additional insulating layer. Preferably the gate electrode is of a material typically polycrystalline silicon which permits its use as a mask in the formation of the source and drain regions so as to achieve accurate alignment with them automatically. Together, each pair of source and drain regions forms with the gate electrode which is disposed between them an individual MIS device.

A third insulating layer covers the common substrate and the devices formed thereon, with openings being provided through the insulating layer to the complementary substrate region, the source and drain regions, and the gate electrodes. On top of the insulating layer a layer of conductors is disposed, with portions of these conductors extending through the openings in the insulating layer into electrical contact with the complementary substrate regions, the source and drain regions and the gate electrodes, thereby operatively interconnecting the MIS devices formed under the two openings in the first layer of insulating material.

In accordance with an important feature of the invention the gate electrodes are made an integral part of a bottom layer of conductors which lie on top of the first insulating layer and which serve to interconnect the MIS devices. Together, the bottom layer of conductors, of which the gates are a part, and the top layer of conductors form a two-layer interconnecting grid, with conductors of the two layers being interconnected at selected points. This two-layer arrangement makes possible a much greater device complexity than has been heretofore possible.

In accordance with another feature of the invention each of the complementary substrate regions contains only a few, and preferably only one, MIS device and each such MIS device is placed on the common substrate adjacent to an MIS device which is formed directly in the substrate and which is of the opposite conductivity type. This is in contrast with current technology in which a large number of the devices are formed in a common complementary substrate region from which a large number of connections must run to the MIS devices of the opposite conductivity type in another portion of the common substrate. By placing mutually opposite conductivity type MIS devices adjacent one another, their interconnection is greatly simplified. Thus, a large number of MIS devices of opposite conductivity types can be formed on a common substrate, permitting the production of complex circuits without overly complicating their interconnection. Moreover, by virtue of the two-layer grid of interconnecting conductors, even relatively complicated electrical circuitry can be handled without complicating the geometrical layout of those conductors.

Other objects and advantages of the invention will become apparent from the following detailed description with reference to the drawings in which:

FIG. 1 is a diagrammatic plan view of a pair of complementary MIS devices formed in a common substrate to form a circuit in accordance with the invention.

FIG. 2 is a cross section along lines 2—2 through the device illustrated in FIG. 1 and showing an MIS device formed in a complementary substrate portion of the common substrate.

FIG. 3 is a cross section along lines 3—3 of FIG. 1 illustrating the other MIS device which is formed directly in the common substrate.

FIG. 4 is a third cross section taken along lines 4—4 of FIG. 1 and illustrating the manner in which the bottom and top conducting layers of the circuit are disposed, and the manner in which the top conducting layer makes contact with the complementary substrate of the first device.

FIG. 5 is a diagrammatic plan view of a more complex circuit made in accordance with the present invention from a plurality of complementary MIS devices and illustrating in particular the simplicity with which a relatively complex electrical circuit can be laid out.

FIG. 6 is a schematic diagram of the circuit whose configuration is illustrated in FIG. 5.

Figure 7A:
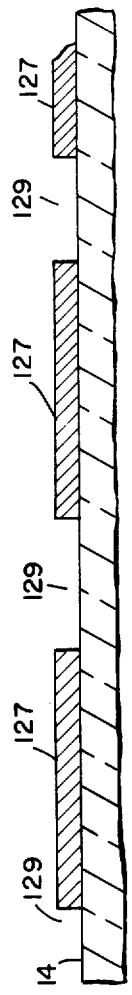
FIG. 7a–7i are cross-sectional elevational views of a complementary MIS integrated circuit in successive stages of its fabrication and illustrating the novel method by which the complementary MIS circuit of the present invention may be formed.

Turning now to the figures, a portion of an integrated circuit 11 made in accordance with the invention and including a pair of opposite conductivity type MIS devices 21 and 23 is illustrated in FIGS. 1–4. Referring to FIGS. 2 and 3 initially the devices 21 and 23 are both formed in a common semiconducting substrate 13 which for purpose of example is illustrated as being an N-type conductivity material. On a major surface 14 of the substrate an insulating layer 15 is formed with a pair of openings 17 therein, one for each of the devices 21 and 23. With the common substrate 13 being of an N-type conductivity material, a P-channel MIS device 21 may be formed directly therein, as illustrated in FIG. 3. It includes a pair of spaced apart source and drain regions 25 and 27 formed directly in the surface 14 of the substrate 13. Disposed between the source and drain regions 25 and 27 and spaced from the surface 14 by an insulating layer 29 is a gate electrode 31 which, together with the source and drain regions, comprises the MIS device 21.

As will be explained in greater detail hereinafter, one of the features of the invention is that the gate electrode 31 is used as a mask, together with the walls of the opening 19, for defining the lateral dimensions of the source and drain regions 25 and 27. For this purpose the gate is preferably made of polycrystalline silicon, because of its high temperature characteristics and stability.

In order to provide the proper substrate for the N-channel MIS device 23, a complementary substrate 43 is formed in the substrate 13 approximately in the outline illustrated in FIG. 2. The complementary substrate 43 is opposite in conductivity type from the common substrate 13 and in the exemplary device illustrated in FIG. 2 is shown as having a P-type conductivity. A pair of N-type conductivity source and drain regions 45 and 47 similar to the regions 25 and 27 of FIG. 3 are formed in the complementary substrate 43 and the gate electrode 51 is disposed between them, being spaced from the surface 14 of the substrate 13 by a gate insulator 49.

In keeping with the invention the gate electrode 31 of the P-channel device 21 is made an integral part of a conductor which extends along the top of the insulating layer 15 toward the P-channel device 23 in order to make contact therewith. Similarly the gate electrode 51 of the P-channel device 23 is made an integral part of a conductor which extends along the surface of the insulating layer 15 away from the device 23 in order to make contact with other circuit components which are not shown. The "gate" conductors are all formed during the same step, are all or substantially the same level, and are covered by an insulating layer 33.

In addition to the set of conductors comprised of the "gate" conductors 31 and 51, a second set of conductors, insulated from the first set by the insulating layer 33 is also provided. The function of the second (or upper level) set of conductors is to make contact with the source and drain regions 25, 27, 45 and 47 of the devices 21 and 23 and also to make contact, where necessary, with the "gate" (or lower level) conductors 31 and 51 as well as to the complementary substrate 43. For this purpose openings, such as the openings 35 and 37 in FIG. 3 are provided. Referring to FIGS. 1 and 2 a portion 55 of one of the upper level conductors serves to connect the "gate" conductor 31 of the device 21 to the drain region 47 of the device 23. The contacts 53, 39 and 41 illustrated in FIGS. 2 and 3 are continuations of other members of the upper level of conductors lying on top of the insulating layer 33.

In order to prevent "floating" of the N-channel device 23 of FIG. 2 a contact is made to its complementary substrate 43 as shown in FIG. 4. For this purpose the complementary substrate 43 extends, as shown in FIG. 1, beyond the source region 45 so as to permit contact to be established with the complementary substrate 43 without having to penetrate the source region 45. Such a contact is established by the upper level conductor 57 extending through the opening 17 in the insulating layer 15 into contact with the substrate 43, as best seen in FIG. 4.

A circuit connection for the gate 51 of the N-channel device 23 is readily established by an upper level conductor 59 which makes direct contact with an extension of gate electrode 51 at 61 as shown in FIGS. 1 and 3.

It is believed readily apparent that the layout of the pair of devices 21 and 23 made possible by the arrangement illustrated in FIGS. 1–4 is particularly compact and simple partly by utilizing the gate electrodes 31 and 51 as integral parts of interconnecting conductors and partly by the use of two levels of interconnecting conductors.

The compact layout which can be achieved by use of the present invention is even better illustrated in FIG. 5 which shows a three-stage circuit having three N-channel devices Q2, Q4 and Q6 and three P-channel devices Q1, Q3 and Q5 formed in a common substrate and interconnected into a three-stage circuit. The schematic diagram of the circuit appears in FIG. 6. Referring first to FIG. 5 for a general explanation of the layout, the three N-channel devices Q2, Q4 and Q6 are formed in individual complementary substrates 73, 75 and 77 respectively. Conversely the three P-channel devices Q1, Q3 and Q5 are formed directly in the common substrate, their outlines being indicated at 79, 81 and 83 respectively. In the case of the P-channel devices the doped regions are indicated by stippling. For the N-channel devices, which are formed in the complementary substrates, those portions of the complementary substrates which extend beyond their doped respective regions are indicated by small circles, in conformance with the convention used for the preceding figures.

The top layer of conductors is shown without crosshatching, the bottom layer of conductors, which includes the gate electrodes, is shown with cross-hatching, and contacts from the top layer of conductors to other points in the circuit is indicated by a square or rectangle with an X in it.

Basically the exemplary circuit illustrated in FIG. 6 includes a first stage comprised of the mutually complementary MIS devices Q1 and Q2 for conditional transfer of a signal from the point P3 under the control of signals applied to the points P1 and P2 to the second stage comprised of the mutually complementary MIS devices Q3 and Q4. The second stage serves to invert the conditionally transferred signal thereto. This inverted signal is applied to the device Q5 which acts as a rectifier and to the device Q6 which serves as an amplifier.

Referring now to both FIGS. 5 and 6, the interconnections between the various MIS devices comprising the circuit of FIG. 6 will be described both electrically with reference to FIG. 6 and physically with reference to FIG. 5. Referring initially to the first stage comprising the devices Q1 and Q2, the source of the device Q1 is connected to a potential P3 through an upper level conductor 85, a lower level conductor 87, with connections being indicated between the conductors 85 and 87 at 86 and between the lower level conductor 87 and the source of Q1 at 88. The drains of Q1 and Q2 are interconnected by an upper level conductor 89 and their source regions are similarly interconnected by an upper level conductor 91. A reference potential E is applied to the exposed portion of the complementary substrate of Q2 through an upper level conductor 93 which also extends to the corresponding portions of the devices Q4 and Q6 to establish contacts with their substrates. A first input signal is applied from a point P1 to the gate of the device Q1 through an upper level conductor 95 which is connected at point 97 marked by an X in FIG. 5 to the lower level conductor 99, the latter being integral with the gate electrode of the device Q1. In a similar manner a second control voltage is applied from the point P2 to the gate of the device Q2 through an upper level conductor 101 which makes contact at point 103 with the lower level conductor 105, the latter being integral with the gate of the device Q2.

The second stage of the circuit illustrated in FIG. 6 is connected between a source of potential P4 and the reference potential E. In particular, the source of the device Q3 is connected to the potential P4 through the upper level conductor 107 which makes contact to the source at point 109. Contact between the drains of the devices Q3 and Q4 is established by the short upper level conductor 111, and the source of the device Q4 is connected to the reference potential E by means of a contact 113 which also serves to connect the complementary substrate of Q4 to the upper level conductor 93 carrying the E reference potential.

To interconnect the gates of the devices Q3 and Q4 those gates are made an integral part of a single lower level conductor 115 which is connected to the interconnected drains of the devices Q1 and Q2 through a contact member 117 which is an extension of the upper level conductor 89 which interconnects those drains.

One output from the second stage of the circuit of FIG. 6 is taken from across the interconnected gates and drains of the devices Q3 and Q4. The interconnected gates of those devices are connected to the drain of the device Q5 by a short upper level conducting portion 119 which connects the gate conductor 115 to the drain region of the device Q5. On the other hand, the interconnected drains of the devices Q3 and Q4 are connected to the gate of the device Q5 by causing the upper level conductor 111 which serves to interconnect those drains to also make contact with an extension of the lower level conductor 121 which is made an integral part of the gate of the device Q5. Finally, contact is made from the source of the device Q5 to the potential P5 through an upper level conductor 123.

The last stage of the circuit of FIG. 6 comprising the P-channel device Q6 is connected across a source of operating potentials P6 and the reference potential E, with the gate electrode of the device being connected to the interconnected drain portions of the devices Q3 and Q4. The latter connection is made by making the gate electrode of the device Q6 to also be an integral part of the lower level conductor 121 which includes as its integral part the gate electrode of the device Q5 since the latter gate electrode is connected to the interconnected drain electrodes of the devices Q3 and Q4.

To establish contact between the source of the device Q6 and the reference potential E, a connection is made at point 125 between the upper level conductor 93 and the source of Q6. Similarly, to establish the required connection between the complementary substrate of the device Q6 and the reference potential E, the contact at 125 is also made to engage the complementary substrate, this being achieved by extending the latter beyond the perimeters of the source region of the device.

A preferred method for producing an integrated circuit having the features illustrated in the preceding figures is shown in FIGS. 7a–7i. As was the case with the illustrated embodiments, it will be assumed that the common substrate in which the devices are to be formed has an N-type conductivity. It should be understood however, that the reverse could also be true and that the various steps could be modified in a manner readily apparent to those skilled in the art to permit the formation of such circuits in P-type conductivity substrates.

Figure 7B:
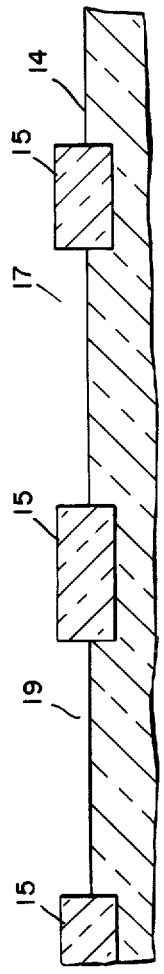

The first principal step is to form the oxide layer 15 on the surface 14 of the substrate 13, with openings 17 and 19 being provided for respective ones of the devices 23 and 21 to be formed. This step is achieved by first depositing over the entire surface 14 a masking layer 127 whose function is to prevent subsequent oxidation of the surface 14 under it. A suitable masking layer for this purpose is a 300 A layer of $SiO_2$ covered by a 1500 A layer of $Si_3N_4$. The portions of the mask 127 are removed from those areas 129 where the oxide layer 15 is to be formed (FIG. 7a). Having thus exposed selected portions of the substrate surface 14 it is thermally oxidized until a layer of oxide approximately 1 micron thick is formed thereon. Preferably this oxide layer extends both above and below the substrate surface 14. The mask 127 is then removed (FIG. 7b).

Figure 7C:
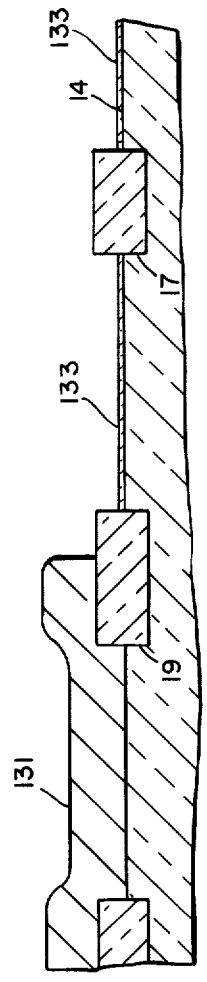

The next major step is to form a complementary substrate under that opening in which an N-channel device is to be formed. This is achieved by first applying a photoresist mask 131 over the substrate surface 14, removing it from those areas where the complementary substrate is to be formed (FIG. 7c). Alternatively, the surface 14 may be oxidized, and the regions 17 and 19 may be opened without the mask 127, using well-known photoresist techniques. The complementary substrate may then be formed by counterdoping the substrate 13 either by the use of a doped oxide or by ion implantation.

To control the surface concentration of ions in the substrate 13, a layer 133 of $SiO_2$ is formed on the surface 14 prior to implantation (FIG. 7c). A suitable dopant is then implanted in the proper concentration through the $SiO_2$ layer 133. A concentration of $10^{13}$ atoms of boron/cm$^2$ has been found suitable. The boron is then driven into the substrate 13 to form the complementary substrate 43. The drive time and temperature will depend on the desired concentration and configuration for the complementary substrate. Heating the implanted substrate in an atmosphere of $N_2$ for 3 hours at 1200° C will give satisfactory results.

Having formed the complementary substrate portions 43, the next major step is to form a layer of electrically insulating material on a portion of the substrate surface 14 within each of the openings 17 and 19. For this purpose an oxide layer 135 is formed on the substrate surface 14, preferably by thermally growing it through subjecting the substrate 13 to an oxidizing atmosphere at an elevated temperature. Typically, the oxide layer 135 will be $SiO_2$ approximately 0.1 micron thick.

Preferably, but not necessarily, a thin (e.g. 300 A) layer of $Si_3N_4$ may be formed on top of the layer 135 to act as a barrier against charge migration.

Figure 7D:
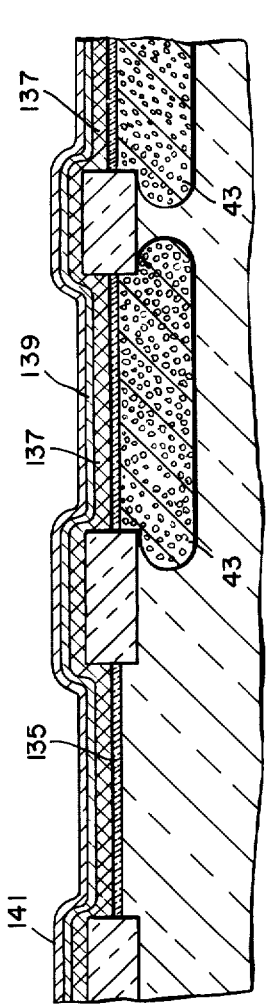

Next a layer of polycrystalline silicon 137 is formed on top of the $SiO_2$ layer 135. The layer 137 will eventually serve as the lower level of conductors which include as their integral part the gate electrodes for the MIS devices. Therefore it will be understood that, while preferably the process includes the formation of a layer of polycrystalline silicon for the lower set of conductors, other conductive materials may also be used. The polycrystalline silicon layer 137 is preferably doped with boron during its deposition and is formed from the pyrolytic decomposition of silane and diborene. A layer of $Si_3N_4$ is deposited on top of the polycrystalline silicon layer 137. Finally on top of the $Si_3N_4$ layer a photoresist masking layer 141 is disposed (FIG. 7d).

Figure 7E:
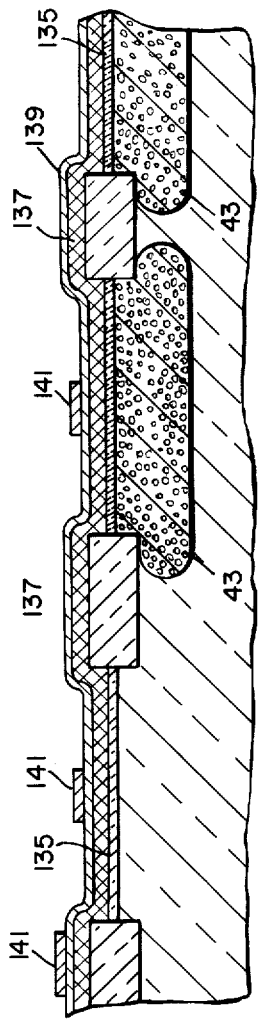

Next, the photoresist layer 141 is removed from all the areas except where the polycrystalline silicon layer 137 is to remain (FIG. 7e). Then by use of a suitable etchant, such as hydrofluoric acid, the $Si_3N_4$ layer 139 is removed from all areas from which the masking layer 141 had been removed. This will leave a temporarily two-layered mask (not shown in the drawings), with the top layer being formed from the photoresist 141 in the configuration shown in FIG. 7e and with the bottom layer of the two-layered mask being formed from the $Si_3N_4$ directly under the remaining portions of the photoresist 141 shown in FIG. 7e. These remaining portions of the photoresist 141 are then removed, since their only purpose is to form the bottom layer of the two-layered mask, namely the portions of the $Si_3N_4$. The latter portions are suitable for etching the layer of polycrystalline silicon 137 whereas the photoresist layer 141 is usually not.

Figure 7F:
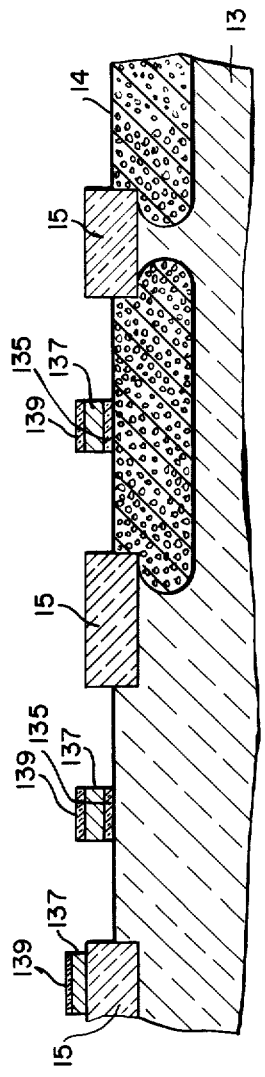

Using the portions of $Si_3N_4$ as a mask, the undesired portions of the polycrystalline silicon layer 137 are etched away, leaving only the desired portions which are protected by the $Si_3N_4$ mask (FIG. 7f). During this same etching step all exposed portions of the $SiO_2$ gate oxide layer 135 are also removed. However, under certain circumstances, such as when the source and drain regions are formed by ion implantation, the $SiO_2$ layer 135 need not be removed.

With the silicon gate formed between the field oxide portions 15, the next step is to form the source and drain regions of the P and N-channel devices, using the silicon gates, the field oxides 15 and either a photoresist (where implantation is to be used) or a deposited layer (where diffusion is to be employed) as a mask against doping.

Figure 7G:
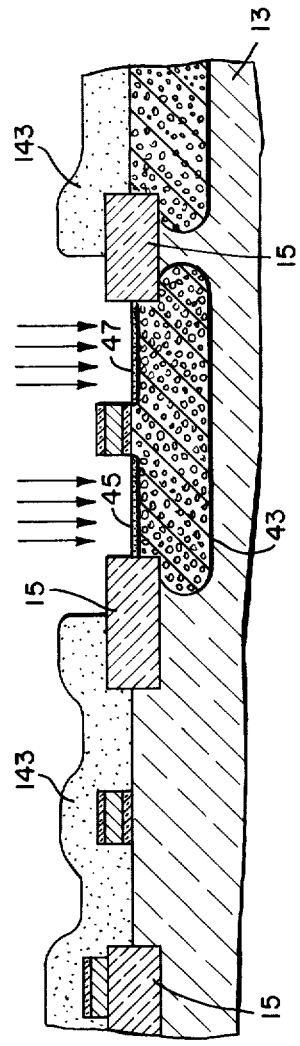

FIG. 7g shows the initial step whereby the complementary substrate 43 in the opening 17 is doped by ion implantation to form source and drain regions 45 and 47 therein. A photoresist mask 143 protects all other areas from ion implantation. The mask 143 is then removed from above the opening 19 and a second mask 145 is formed on top of the opening 17 after which the exposed opening 19 is subjected to ion implantation so as to cause the source and drain regions 25 and 27 to be formed with the proper P-type conductivity. Suitable doping concentrations for the ion implantation are $10^{15}$ boron or phosphorus ions/cm$^2$ at 100 KeV followed by a 30 minute drive in nitrogen at 100° C.

Figure 7H:
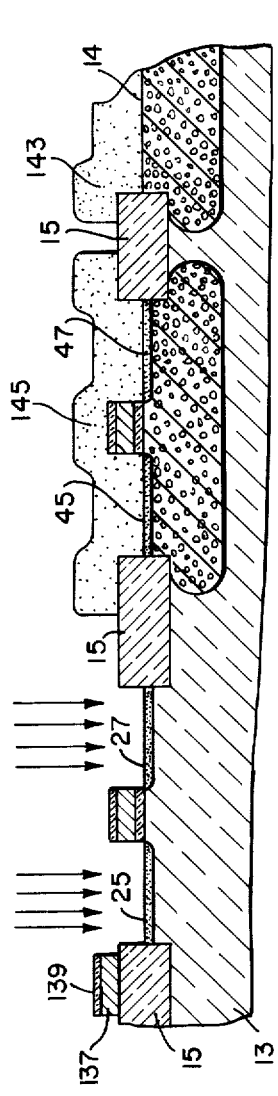

If the doping of the source and drain regions is to be by diffusion rather than by ion implantation as shown in FIGS. 7g and 7h, a deposited mask typically of silicon oxide is applied instead of the photoresist mask 143 and N-type impurities are introduced in the complementary substrate 43. The deposited mask is then stripped and a new deposited mask, again typically of silicon oxide is applied over all of the openings except that in which P-type diffusions are to be formed and P-type impurities are then introduced therein. A deposited mask rather than the photoresist mask is used with diffusion because of the high temperatures involved.

Figure 7I:
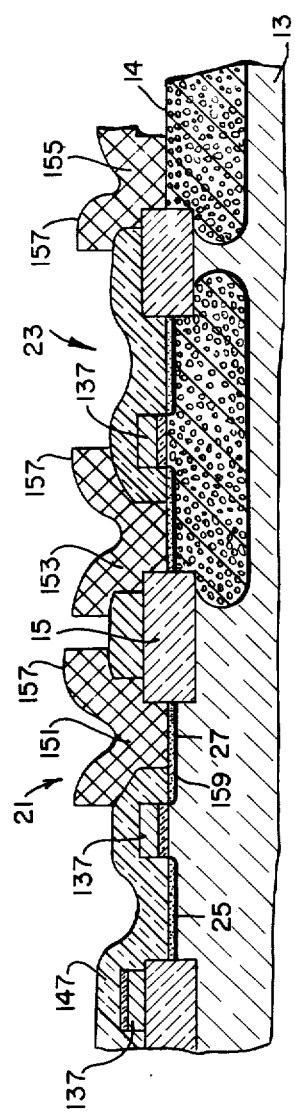

The remaining steps are directed toward depositing the upper layer of conductors as illustrated in FIG. 7i. First the remaining photoresist mask 145 is removed and it is often desirable to remove the portions of the $Si_3N_4$ layer 139 on the silicon gates in the openings 17 and 19. Thereafter an insulating layer 147 is deposited over the entire assembly so as to cover all of the lower level conductors 137 as well as the openings 17 and 19 and even the field oxide portions 15 between them. Contact openings are then etched through the insulating layer 147 to the source, drain, and complementary substrate regions as illustrated at 151, 153, and 155 respectively. Openings are also etched through the layer 147 to expose selected portions of the lower set of conductors 137, these openings not being shown in FIG. 7i. Finally the upper set of conductors is deposited. These may comprise a layer of aluminum 157 evaporated on top of the insulating layer 147 and etched in order to define the desired upper level conductor pattern.

The method of construction illustrated in FIGS. 7a–7i has several advantages. (1) The use of the silicon gate as a mask for the source and drain diffusions results in accurate alignment between the gate and the diffusions and consequently in better device performance. Another advantage of the disclosed method of construction is derived from the fact that the field oxide layer 15 extends below the substrate surface 14. If the field oxide portions 15 did not so extend, the P-N junctions between the source and drain diffusions and the substrate and complementary substrate portions which immediately surround them would extend to the substrate surface 14 in the vicinity of the field oxide. With the field oxide 15 extending below the substrate 14, however, the P-N junctions do not even approach the substrate surface. As a result, if one of the contact openings such as the opening 151 in FIG. 7i were to be slightly misplaced so as to cut into the edge of the field oxide, the opening would not reach the P-N junction. Conversely, if this were not the case and if the P-N junction 159 were permitted to extend up to the substrate surface 14, the contact formed in the opening 151 would short circuit that junction and vitiate the operation of the MIS device which is involved. Moreover, since there is no longer a danger of short circuiting the P-N junction near the field oxide 15, it is no longer necessary to provide a space between a contact opening such as the opening 151 in FIG. 7i and the field oxide 15 which is adjacent thereto in order to prevent the shorting of the P-N junction. This in turn reduces the total space requirements for the circuit, permitting it to be made considerably more compact than by previous methods.

It is also worth noting that the problem of field inversion is greatly reduced by the method of FIG. 7a–7i. This is so because inversion, or the formation of a conductive channel at the surface which causes two doped regions to be electrically connected via the substrate, does not occur over a heavily doped region such as the source and drain regions in the complementary substrate 43. Since these regions abut directly against the thick field oxide portions 15 and occupy the entire region 17 except for the area under the silicon gate, there is no space over which inversion can occur insofar as the N-channel device formed in the complementary substrate 43 is concerned. A potential problem of inversion still exists over the N-type conductivity substrate 13 but this tends inherently not to be as serious over an N-type conductivity material as it does over the P-type conductivity material, such as the complementary substrate, due to the effect of charge in the surface states commonly referred to as $Q_{ss}$.

What is claimed is:

1. In the process of producing an SIS circuit having at least one N-channel and one P-channel device with interconnected gates in a surface of a semiconductor substrate of a given type of conductivity, the steps of:

a. forming an insulating layer on said surface, said layer having an opening therein for each of said devices;
   b. forming a complementary substrate under one of said openings for one of said devices;
   c. disposing a gate insulator of electrically insulating material on a portion of said substrate within each of said openings;
   d. forming on said layer of insulating material a multi-layered strip comprising an integral strip of electrically conductive polycrystalline silicon doped to have a given type of conductivity to serve as interconnected gates for said devices and a dopant-impervious insulating layer covering said polycrystalline silicon strip; and
   e. with said multi-layered strip and said insulating layer as a mask, successively doping selected spaced-apart areas within respective ones of said openings with mutually opposite conductivity type determining impurities to convert them into source and drain regions of opposite conductivity from the substrate immediately surrounding them, without changing the conductivity type of said silicon strip.

2. In the process of producing an SIS circuit, having at least one N channel and one P channel device, with interconnected gates in a surface of a silicon substrate of a given type of conductivity, the steps of:

a. growing a field oxide layer on said silicon surface, said layer having an opening therein for each of said devices;
   b. with said oxide layer as a mask, doping said silicon under one of said openings with a conductivity type, so as to form a complementary substrate under said one opening;
   c. growing a gate oxide layer within said openings;
   d. depositing a doped polycrystalline silicon layer over said oxide layer in said openings;
   e. forming a dopant-impervious insulating layer over, and in contact with, said polycrystalline silicon layer;
   f. selectively removing portions of said insulating layer to cover thereby that portion of said polycrystalline layer which is to serve as said interconnected gates;
   g. with the remaining portion of said insulating layer as a mask selectively etching away portions of said polycrystalline silicon layer to form an integral insulated gate structure extending into both of said openings to serve as the respective insulated gates of both of said devices; and
   h. with said insulated gates and said field oxide layer as a mask, and with said insulated gates being protected by the remaining portion of said insulating layer from further doping, successively doping selected spaced-apart areas of silicon substrate within respective ones of said openings with mutually opposite conductivity type determining impurities to convert those areas into source and drain regions of opposite conductivity from the substrate immediately surrounding them, without changing the conductivity type of said integral insulated gate structure.

* * * * *